(12) United States Patent
Wynne (10) Patent No.: US 7,944,199 B2
(45) Date of Patent: May 17, 2011

(54) VOLTAGE-MEASURING CIRCUIT AND METHOD

(75) Inventor: John Wynne, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 98 days.

(21) Appl. No.: 12/398,666

(22) Filed: Mar. 5, 2009

(65) Prior Publication Data

US 2010/0225304 A1    Sep. 9, 2010

(51) Int. Cl.
*G01R 1/02* (2006.01)
*G01R 7/00* (2006.01)

(52) U.S. Cl. ........ 324/126; 324/140; 324/142; 324/691; 327/205

(58) Field of Classification Search .................. 324/126, 324/158.1, 131, 140 R–142; 327/205
See application file for complete search history.

(56) References Cited

U.S. PATENT DOCUMENTS

| | | | | |
|---|---|---|---|---|
| 5,166,549 | A * | 11/1992 | DeDoncker | 327/79 |
| 6,909,272 | B2 * | 6/2005 | Bengtsson | 324/126 |
| 7,365,528 | B2 * | 4/2008 | Kawamura | 324/131 |

OTHER PUBLICATIONS

L. Prokop, et al., "Sensorless BLDC Motor Control on MC68HC908MR32 Software Description," Freescale Semiconductor, Inc. 2004.
"Using Dallas Battery Management ICs with High Voltage Battery Packs," Maxim Integrated Products, May 1, 2001.
"Quad UV/OV Positive/Negative Voltage Monitor," Linear Technology Corporation 2006.

* cited by examiner

*Primary Examiner* — Ha Tran T Nguyen
*Assistant Examiner* — Emily Y Chan
(74) *Attorney, Agent, or Firm* — Kenyon & Kenyon LLP (57) ABSTRACT

An embodiment of a voltage-measuring circuit includes: a first resistor connected to a first measurement node; a second resistor connected to the first resistor and a second measurement node; a configuration switch configured to, in response to a control signal, selectively interconnect the first and second resistors, during enable and disable phases of the control signal respectively, into and out of either a parallel or a series configuration; and a control and measurement circuit configured to provide the control signal, receive a first measurement voltage from the first and second measurement nodes during the enable phase, and receive a second measurement voltage from the first and second measurement nodes during the disable phase.

39 Claims, 7 Drawing Sheets

VOLTAGE-MEASURING CIRCUIT AND METHOD

BACKGROUND INFORMATION

A need exists to measure and monitor voltages in many circuits and applications. For example, a circuit may monitor a supply or signal voltage level to determine specific operating conditions, such as may trigger a shutdown during low-power conditions or a specific circuit operation in response to a predetermined signal level. In one common scenario, a voltage to be monitored is a relatively high voltage, and the monitoring is performed using a circuit that either cannot operationally monitor a voltage of such a magnitude or which is not desirable to be designed to operate in such a manner as to directly monitor a voltage of such a magnitude. For example, direct monitoring of a voltage magnitude of several hundred volts may be desired, but such could destroy many integrated circuits that typically can withstand voltage magnitudes of no greater than tens of volts.

Figure 1A:
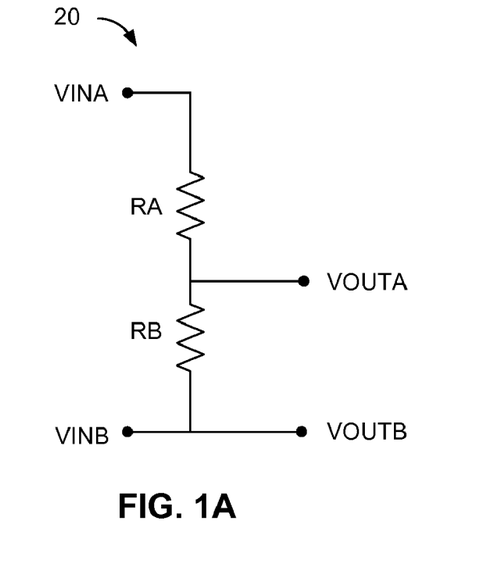
FIGS. 1A and 1B are circuit schematics depicting embodiments of resistive voltage-divider circuits.
Figure 1B:
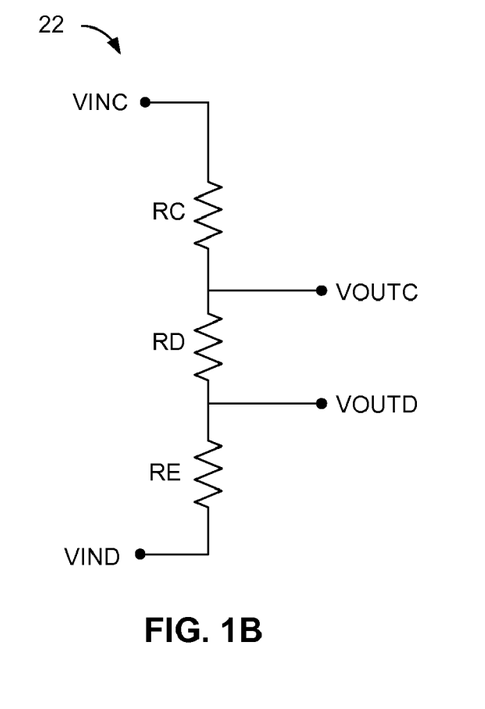

FIGS. 1A and 1B depict typical embodiments of resistive voltage-divider circuits 20, 22 in which a relatively high input voltage is monitored using the resistive voltage divider to produce a relatively low output voltage having a magnitude that is a known function of the input voltage. In FIG. 1A, the input voltage VI_1A appears between first and second input terminals VINA, VINB of the voltage divider 20, i.e., VI_1A=VINA−VINB. The voltage divider 20 includes first and second resistors RA, RB, and produces an output voltage VO_1A between a first and second output terminals VOUTA, VOUTB, i.e., VO_1A=VOUTA−VOUTB, having a value determined by the following equation: VO_1A=VI_1A*RB/(RA+RB). In the case that a large degree of voltage division is desired (e.g., in order to monitor a very large voltage using a circuit designed to run on an ordinary supply voltage), the ratio of RA to RB can be made relatively large.

The resistive voltage divider 22 of FIG. 1B is similar to that of FIG. 1A, and includes first, second and third resistors RC, RD, RE arranged in a resistor string between first and second input terminals VINC, VIND, and receives an input voltage VI_1B applied between both ends of the resistor string, i.e., VI_1B=VINC−VIND. The voltage divider 22 of FIG. 1B produces an output voltage VO_1B at first and second output terminals VOUTC, VOUTD positioned about the second resistor RD in the three-resistor resistor string, i.e., VO_1B=VOUTC−VOUTD, having a value determined by the following equation: VO_1B=VI_1B*RD/(RC+RD+RE). As with the embodiment of FIG. 1A, in the case that a large degree of voltage division is desired, the ratio of RC and RE to RD can be made relatively large.

A major problem exists, however, with the embodiments of both FIGS. 1A and 1B. In both cases, when implementing a large degree of voltage division, the output voltages are a function of the ratio of a large resistance value to a small resistance value (or a similar mathematical quantity). Thus, the accuracy of the correspondence of the output voltage to the input voltage is a function of the accuracy of this ratio, and therefore to effectuate an accurate known degree of voltage division, this ratio needs to have an accurate known predetermined value. However, manufacturing a resistive divider that achieves an accurate ratio between large and a small resistance values can be difficult and expensive. In particular, it is impractical and inefficient (from a chip-area perspective) to provide very large resistors in an integrated circuit. Alternatively, it is difficult and expensive to produce and match external resistance values to either that of other external resistors or to integrated resistors. It is also difficult to maintain the accuracy and stability of a ratio of two very different resistance values over temperature variations. Thus, there is a need in the art for a circuit and a method for measuring voltages that does not depend on the predetermined accuracy of a ratio of a relatively large resistance value to a relatively small resistance value.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

DETAILED DESCRIPTION OF EXAMPLE EMBODIMENTS

An embodiment of a voltage measuring circuit include first and second resistors, a configuration switch, and a control and measurement circuit. The first resistor is connected to a first measurement node. The second resistor is connected to the first resistor and a second measurement node. The configuration switch is configured to, in response to a control signal, selectively interconnect the first and second resistors into and out of one of either a parallel or series configuration during two distinct phases (i.e., enable and disable phases) of the control signal, respectively. The control and measurement circuit is configured to provide the control signal, receive a first measurement voltage between the first and second measurement nodes during a first phase (i.e., the enable phase), and receive a second measurement voltage between the first and second measurement nodes during a second phase (i.e., the disable phase).

An embodiment of a method includes: providing the first (enable) phase of the control signal to the configuration switch to configure a first interconnection of the first and second resistors; receiving, by the control and measurement circuit, the first measurement voltage produced, corresponding to an input voltage, as a function of the first interconnection; providing the second (disable) phase of the control signal to the configuration switch to configure a second interconnection of the first and second resistors; and receiving, by the control and measurement circuit, the second measurement voltage produced, corresponding to the input voltage, as a function of the second interconnection. The method can also include determining a ratio between a resistance value of a third resistor, connected to the first resistor, and a common resistance value of the first and second resistors based on the received first and second measurement voltages; as well as determining the input voltage based on (i) the determined ratio and (ii) one of the first and second measurement voltages.

Figure 2:
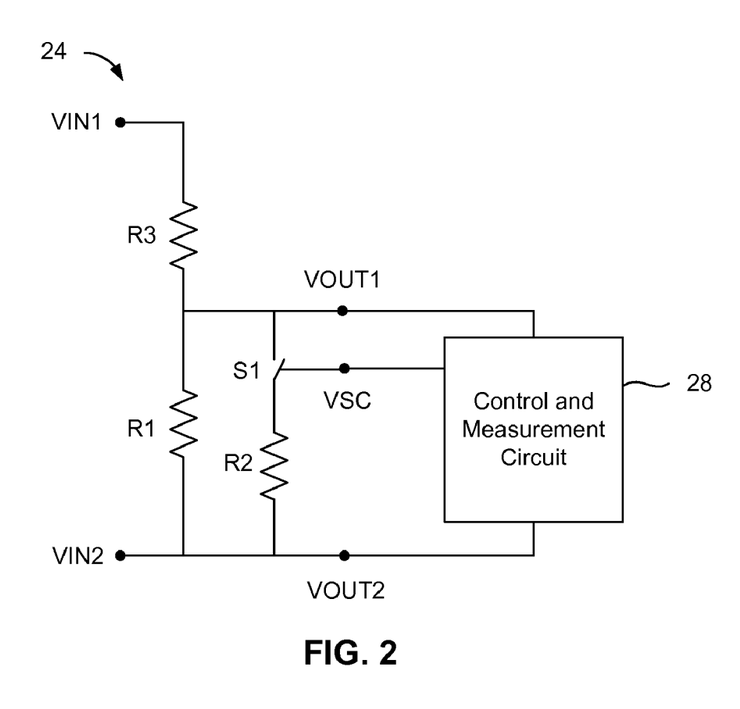
FIG. 2 is a circuit schematic depicting an embodiment of a voltage-measuring circuit.

FIG. 2 is a circuit schematic depicting one embodiment of the voltage-measuring circuit 24 in which first and second measurement resistors R1, R2 are selectively switched into and out of a parallel configuration. The depicted embodiment includes first measurement resistor R1 and a third resistor R3 arranged in series between a first input terminal VIN1 and a second input terminal VIN2 configured to receive an input voltage VI (where VI=VIN1−VIN2). The second measurement resistor R2 and a resistor configuration switch S1 are connected in parallel with the first measurement resistor R1. A measurement output voltage VO exists between a first measurement output terminal VOUT1 and a second measurement output terminal VOUT2, i.e., VO=VOUT1−VOUT2, that are located at respective ends of the parallel combination of the first measurement resistor R1 and the series-connected resistor configuration switch S1 and second measurement resistor R2.

The resistor configuration switch S1 is configured to receive a switch control signal VSC at a switching control terminal. When the resistor configuration switch S1 is enabled, i.e., closed, the second measurement resistor R2 is effectively connected electrically in parallel with the first measurement resistor R1, and the measurement output voltage VO is the voltage produced across the first and second measurement output terminals OUT1, OUT2 across the parallel combination of the first and second measurement resistors R1, R2 when current is running through both of these measurement resistors R1, R2. When the resistor configuration switch S1 is disabled, i.e., open, the second measurement resistor R2 is removed from being in parallel with the first measurement resistor R1, and the measurement output voltage VO is the voltage produced between the first and second measurement output terminals VOUT1, VOUT2 across only the first measurement resistor R1 when current is running through this measurement resistor R1. In FIG. 2, when the resistor configuration switch S1 is disabled, the second measurement resistor R2 has a terminal that is effectively left floating. In other embodiments, however, the second measurement resistor R2 can optionally have this terminal instead connected to another circuit node when the resistor configuration switch S1 is disabled.

The voltage-measuring circuit 24 of FIG. 2 also includes a control and measurement circuit 28 configured to provide the switch control signal VSC to the resistor configuration switch S1, and receive a measurement output voltage VO at the first and second output terminals VOUT1, VOUT2. The control and measurement circuit 28 can optionally be configured to also generate the switch control signal VSC, as well as process the received measurement output voltage VO. In another embodiment, the control and measurement circuit 28 can instead route, and optionally modify, a signal received at the control and measurement circuit 28 to provide the switch control signal VSC.

Figure 3A:
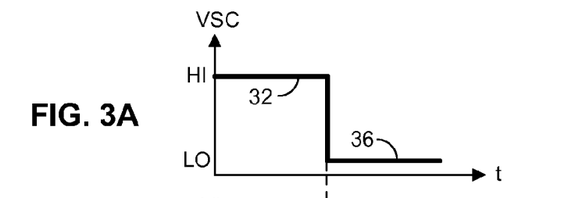
FIGS. 3A, 3B and 3C are graphs depicting embodiments of a switch control signal, an input voltage and a measurement output voltage, respectively, associated with operation of embodiments of the voltage-measuring circuit.
Figure 3B:
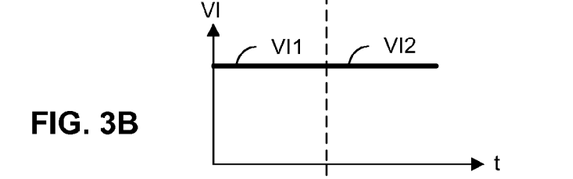
Figure 3C:
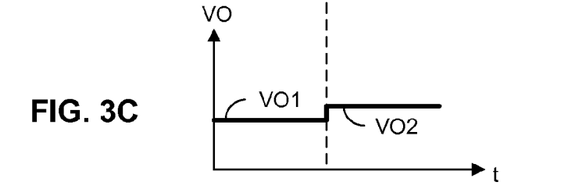

FIGS. 3A, 3B and 3C are graphs depicting exemplary embodiments of the switch control signal VSC, the input voltage VI, and the output measurement voltage VO, respectively, as functions of time. FIG. 3A depicts an embodiment of the switch control signal VSC having a first phase 32 (i.e., enable phase 32, or switch-closed phase 32) and a second phase 36 (i.e., a disable phase 36, or switch-open phase 36). In FIG. 3A, the switch control signal VSC switches between a logic-high voltage and a logic-low voltage, with the enable phase 32 coinciding with the logic-high voltage and the disable phase 36 coinciding with the logic low voltage. However, in other embodiments, the switch control signal VSC can include other alignments of the enable and disable phases 32, 36 to specific voltage levels, such as, e.g., the disable phase 36 being aligned to the logic-high voltage and the enable phase 32 being aligned to the logic-low voltage. Furthermore, although FIG. 3A shows a single enable phase 32 and a single disable phase 36 of the switch control signal VSC, during the operation of the voltage-measuring circuit 24 the control and measurement circuit 28 can provide a switch control signal VSC having a plurality of enable phases 32 and a plurality of disable phases 36. For example, the control and measurement circuit 28 can be configured to provide a switch control signal VSC which is a square wave, alternating between logic-high and logic-low voltages at a predetermined frequency and duty cycle. Other specific embodiments of the switch control signal VSC are also possible.

In operation, the control and measurement circuit 28 provides the switch control signal VSC to the resistor configuration switch S1 to selectively switch the second measurement resistor R2 into and out of parallel configuration with the first measurement resistor R1 during the enable and disable phases 32, 36, respectively. During the enable phase 32, a first measurement output voltage VO1 is produced across the first and second measurement output terminals VOUT1, VOUT2. This first measurement output voltage VO1 is the voltage produced across the parallel combination of the first and second measurement resistors R1, R2 as a result of the input voltage VI1 applied across the input terminals VIN1, VIN2 at that time. This first input voltage VI1 can be represented as a function of the first measurement output voltage VO1 by the following equation: VI1=((R1*R2)/(R1+R2)+R3)*VO1)/((R1*R2)/(R1+R2)). FIG. 3B depicts an embodiment of the input voltage VI as a function of time, including the input voltage VI1 present during the enable phase 32 of the switch control signal VSC. FIG. 3C depicts an embodiment of the measurement output voltage VO as a function of time, including the measurement output voltage VO1 produced during the enable phase 32 of the switch control signal VSC.

During the disable phase 36, a second measurement output voltage VO2 is produced across the first and second measurement output terminals VOUT1, VOUT2. This second measurement output voltage VO2 is the voltage produced across only the first measurement resistor R1 as a result of the input voltage VI2 applied across the input terminals VIN1, VIN2 at that time. This second input voltage VI2 can be represented as a function of the second measurement output voltage VO2 by the following equation: $VI2=((R1+R3)*VO2)/R1$. FIG. 3B depicts an embodiment of the second input voltage VI2 present during the disable phase 36 of the switch control signal VSC, and FIG. 3C depicts an embodiment of the second measurement output voltage VO2 produced during the disable phase 36 of the switch control signal VSC.

In one embodiment, the first and second measurement resistors R1, R2 are configured to have an equal, or substantially equal, common resistance value R. In such an embodiment, if the input voltages VI1, VI2 during the enable and disable phases 32, 36 are assumed to be equal, i.e., the input voltage VI is not changing rapidly in comparison to a switching frequency of the switch control signal VSC, then the above equations representing the first and second input voltages VI1, VI2 as a function of the first and second measurement output voltages VO1, VO2 can be equated and manipulated to determine a representation of the ratio of the common measurement resistance value R to the third resistance value. That is, assuming the first and second measurement resistance values R1, R2 are equal to a common resistance value R, i.e., $R=R1=R2$, the above equations representing the first and second input voltages VI1, VI2 can be equated and manipulated to determine the following equation representing the ratio of this common measurement resistance value R to the third resistance value: $R/R3=(((2*VO1)/VO2)-1)/(1-(VO1/VO2))$.

Thus, in operation, receipt of the output measurement voltages VO by the control and measurement circuit 28 provides a basis for determining the ratio of the common measurement resistance value R to the third resistance value R3. This is in turn provides a basis for determining the input voltage VI. For example, the above equation representing the input voltage VI as a function of the second measurement output voltage VO2 can be manipulated to express the input voltage VI as a function of the ratio of the common measurement resistance value R to the third resistance value R3, as follows: $VI=VI2=(1+R3/R1)VO2=(1+R3/R)VO2$. Thus, the voltage-measuring circuit 24 of FIG. 2 enables an accurate determination of the ratio of the common measurement resistance value R to the third resistance value R3, without knowing such beforehand, or necessitating the expense and difficulty of design of a circuit to have an accurate predetermined value of this ratio (as was one problem of the resistive voltage-divider circuits 20, 22 of FIGS. 1A and 1B), which in turn enables an accurate determination of the input voltage VI as a function of this determined ratio R/R3 and one of the measurement output voltages VO1, VO2.

In another embodiment, a similar beneficial result can be achieved if the first and second measurement resistors R1, R2 are designed to have an accurate known resistance value ratio, or relationship, instead of having the common resistance value R. Although in such an embodiment the corresponding analytical equations may differ somewhat from those presented above, the circuit function and associated methodology can be the same, i.e., first an operational determination of the ratio, or relationship, of the third resistance value R3 to the known ratio, or relationship, between the first and second measurement resistance values R1, R2 is performed, then, second, an operational determination of the input voltage VI as a function of this operationally-determined ratio, or relationship, of the third resistance value R3 to the known ratio, or relationship, between the first and second measurement resistance values R1, R2, is performed. Such an embodiment, although not as simple as the embodiment in which the first and second measurement resistance values R1, R2 are equal, still achieves considerable resolution of the problem of the circuits 20, 22 of FIGS. 1A and 1B, in that it no longer requires design and manufacture of an accurate predetermined ratio of a first (or second) measurement resistance value R1 to the third resistance value R3.

Figure 4:
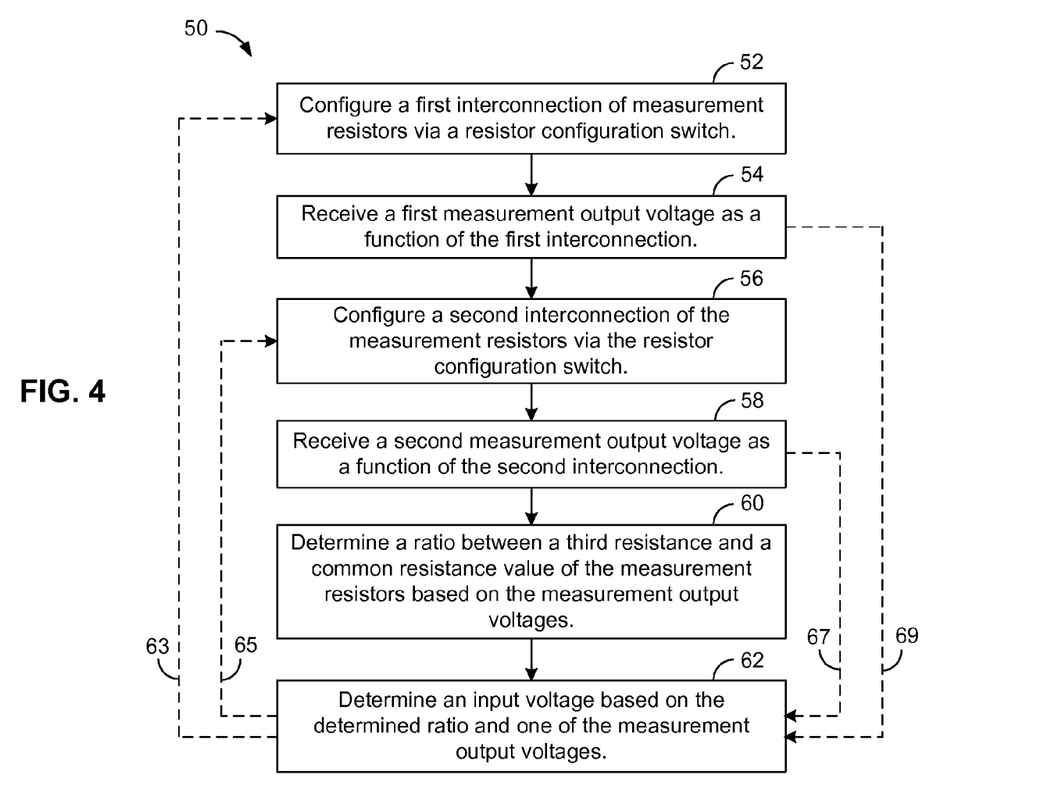
FIG. 4 is a flow chart depicting an embodiment of a method of operating embodiments of the voltage-measuring circuit.

FIG. 4 is a flowchart depicting one embodiment of a method 50 of operating the voltage-measuring circuit of FIG. 2. Note that, although the embodiment of FIG. 4 summarizes certain aspects of the discussion herein in regard to the operation of embodiments of the voltage-measuring circuit 24, other embodiments of the method 50, which may include other aspects discussed herein, or fewer aspects than depicted, are also possible. Step 52 includes providing the enable phase 32 of the switch control signal VSC to the resistor configuration switch S1 to configure a first interconnection (e.g., into a parallel configuration) of the first and second measurement resistors R1, R2. Subsequently, step 54 includes receiving, by the control and measurement circuit 28, the first output measurement voltage VO1 produced, corresponding to the first input voltage VI1, as a function of the first interconnection. Subsequently, step 56 includes providing the disable phase 36 of the switch control signal VSC to the resistor configuration switch S1 to configure a second interconnection (e.g., disconnecting the parallel configuration) of the first and second measurement resistors R1, R2. Subsequently, step 58 includes receiving the second output measurement voltage VO2 produced, corresponding to the second input voltage VI2, as a function of the second interconnection. Subsequently, step 60 includes determining the ratio (or relationship) between the third resistance value R3 and the common (or related) measurement resistance values R (or R1/R2) based on the received first and second output measurement voltages VO1, VO2. Subsequently, step 62 includes determining the input voltage VI based on (i) the determined ratio (or relationship) between the third resistance value R3 and the common (or related) measurement resistance values R (or R1/R2) and (ii) one of the received output measurement voltages VO1, VO2.

Once the ratio (or relationship) between the third resistance value R3 and the common (or related) measurement resistance values R (or R1/R2) has been determined a first time, it is optionally not necessary for this ratio (or relationship) to be re-determined for each subsequent determination of the input voltage VI. Instead, the previously-determined ratio (or relationship) can be re-used during the determination at step 62 of the input voltage VI based on the determined ratio (or relationship) and the one of the received output measurement voltages VO1, VO2. Thus, FIG. 4 depicts optional routes between steps that can be utilized subsequent to an initial determination of the ratio (or relationship) at step 60. The method 50 can return to step 52 after step 62, jumping via route 63, to configure the first interconnection of the first and second measurement resistors R1, R2, and then move on to step 54 to receive the first output measurement voltage VO1 produced as a function of the first interconnection. Since a value of the ratio (or relationship) has already been determined, a determination of a new input voltage VI can be accomplished with only the additional input of a single one of the received output measurement voltages VO1, VO2. Therefore, from step 54 the method 50 can optionally jump, via route 69, back to step 62. In a similar way, once a value of the ratio (or relationship) has been determined, the method can alternatively instead jump, via route 65, from step 62 back to step 56 to configure the second interconnection of the first and second measurement resistors R1, R2, and then move on to step 58 to receive the second output measurement voltage VO2 produced as a function of the second interconnection, as either the first or second output measurement voltage VO2 can be used in conjunction with the previously determined value of the ratio (or relationship). The method 50 can then optionally jump, via route 67, back to step 62.

During performance of the method 50, a decision can be made whether to re-use a previously determined ratio (or relationship) between the third resistance value R3 and the common (or related) measurement resistance values R (or R1/R2) (and, e.g., jump between method steps using any or all of routes 63, 65, 67, 69), or to re-calculate the ratio (or relationship) from newly received first and second output measurement voltages VO1, VO2 (i.e., return to step 60 via, e.g., route 63 and steps 52, 54, 56, and 58). The decision of whether to re-use or re-calculate the ratio (or relationship) can be made based on operational factors, such as a temperature change or some other operational input or measurement. For example, the control and measurement circuit 28 can be configured to receive signals representative of periodic temperature measurements (indicating, e.g., a temperature of the voltage-measuring circuit 20, its external environment, or both), and based on evaluation of a predetermined criterion related to the temperature measurements (such as, e.g., the occurrence of a predetermined temperature change from a previous temperature measurement, or the occurrence of at least a predetermined instant temperature level, etc.) either re-use or re-calculate the ratio (or relationship).

Figure 5:
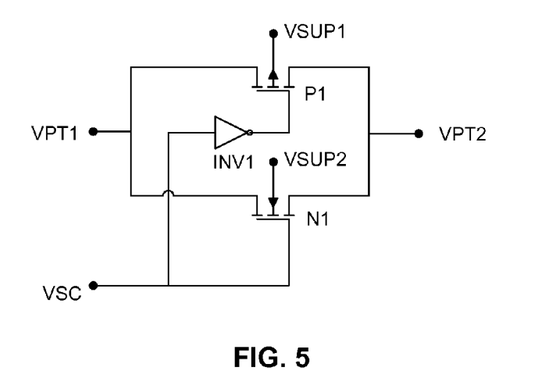
FIG. 5 is a circuit schematic depicting an embodiment of a resistor configuration switch of the voltage-measuring circuit.

The resistor configuration switch S1 can be implemented in a variety of ways. FIG. 5 is a circuit schematic depicting one embodiment of a transistor implementation of the resistor configuration switch S1. In FIG. 5, the transistor implementation includes an NMOS transistor N1 and a PMOS transistor P1 arranged in parallel, with sources of the NMOS and PMOS transistors N1, P1 connected together and connected to a first pass-through terminal VPT1, and drains of the NMOS and PMOS transistors N1, N2 connected together and connected to a second pass-through terminal VPT2. The gate of the NMOS transistor N1 is connected to the switching control terminal VSC, and the gate of the PMOS transistor P1 is connected to the switching control terminal via an inverter INV1. The body connections of the PMOS and NMOS transistors P1, N1 are connected to first and second supply voltage terminals VSUP1, VSUP2, respectively.

Figure 6:
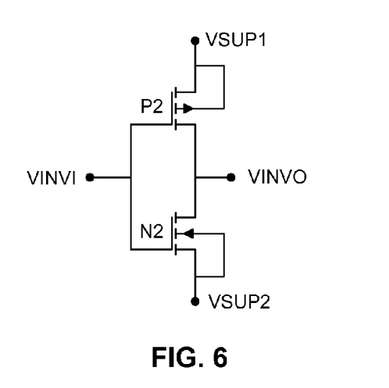
FIG. 6 is a circuit schematic depicting an embodiment of an inverter of embodiments of the resistor configuration switch.

FIG. 6 is a circuit schematic depicting one embodiment of the inverter INV1. In FIG. 6, an NMOS transistor N2 and PMOS transistor P2 are arranged with their gates connected together at the inverter input VINVI, and their drains connected together at the inverter output VINVO. The sources and bodies of the NMOS and PMOS transistors N2, P2 are connected to the first and second supply voltage terminals VSUP1, VSUP2.

Figure 7:
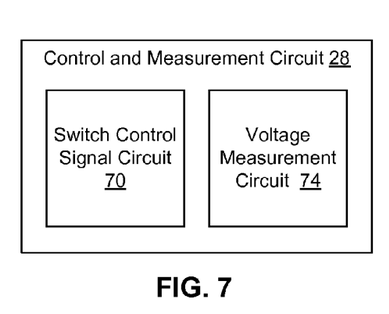
FIG. 7 is a schematic diagram depicting an embodiment of a control and measurement circuit of embodiments of the voltage-measuring circuit.

The control and measurement circuit 28 can take various forms to implement the functionality discussed herein. FIG. 7 depicts one embodiment of the control and measurement circuit 28 having a switch control signal circuit 70 and a voltage measurement circuit 74. The switch control signal circuit 70 provides the switch control signal VSC to the switching control terminal of the resistor configuration switch S1. The voltage measurement circuit 74 receives the measurement output voltage VO from the first and second output terminals VOUT1, VOUT2.

The switch control signal circuit 70 can be configured in different ways. The switch control signal circuit 70 can optionally include circuitry to enable operation according to one, a plurality, or all of the following schemes: (i) the switch control signal circuit 70 autonomously or semi-autonomously generates and provides the switch control signal VSC to the resistor configuration switch S1, (ii) the switch control signal circuit 70 process a signal received by the switch control signal circuit 70 to generate and provide the switch control signal VSC to the resistor configuration switch S1, and (iii) the switch control signal circuit 70 receives the switch control signal VSC from another circuit and provides the received switch control signal VSC to the resistor configuration switch S1.

Figure 8:
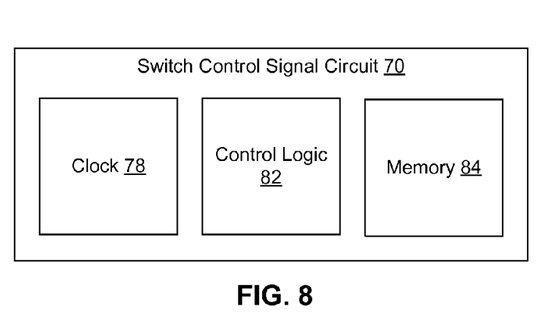
FIG. 8 is a schematic diagram depicting an embodiment of a switch control signal circuit of embodiments of the control and measurement circuit.

FIG. 8 depicts one embodiment of the switch control signal circuit 70 that can be configured to implement one, a plurality, or all of the above operational schemes. The depicted embodiment includes a clock 78, control logic 82 and a memory 84. The clock 78 can generate a square wave signal at an adjustable frequency and duty cycle. The clock 78 can include an oscillator, such as either an autonomously running oscillator, a voltage-controlled oscillator, or a crystal-controlled oscillator. The control logic 82 is configured to receive the clock signal generated by the clock 78 and generate and provide the switch control signal VSC from the received clock signal. The control logic 82 can optionally be configured to receive an instruction, in the form of either an instruction signal received by the switch signal control circuit 70 from another circuit external to the switch control signal circuit 70, or in the form of an instruction stored in the memory 84 of the switch control signal circuit 70, to control the frequency and duty cycle of the switch control signal VSC, either by providing a second instruction signal to the clock 78 to effectuate such control, or by processing the clock signal received from the clock 78 to effectuate the control.

Other embodiments of the switch control signal circuit 70 are possible. The switch control signal circuit 70 can optionally not include the memory 84, or use a portion of a memory of another circuit, such as, e.g., a portion of a memory 98 of the voltage measurement circuit 74. The switch control signal circuit 70 can also optionally consist essentially of only routing to deliver a version of the switch control signal VSC received from another circuit to the resistor configuration switch S1.

Figure 9:
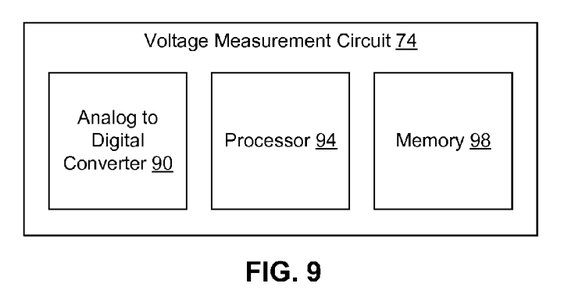
FIG. 9 is a schematic diagram depicting an embodiment of a voltage measurement circuit of embodiments of the control and measurement circuit.

The voltage measurement circuit 74 can also be configured in different ways. The voltage measurement circuit 74 can optionally include circuitry to enable operation according to one, a plurality, or all of the following schemes: (i) the voltage measurement circuit 74 receives the first and second measurement output voltages VO1, VO2 during, and timed to, the enable and disable phases 32, 36 of the switch control signal VSC, converts these received voltages VO1, VO2 to a digital form, processes the converted first and second output measurement voltages VO1, VO2 to determine the input voltage VI according to the algorithm discussed above, and provides a representation of the determined input voltage VI as an output; (ii) the voltage measurement circuit 74 receives the first and second output measurement voltages VO1, VO2 during the enable and disable phases 32, 36 of the switch control signal VSC, converts these received voltages VO1, VO2 to a digital form, and processes the converted first and second output measurement voltages VO1, VO2 to determine and provide the ratio (or relationship) of the common (or related) measurement resistance value R (or R1/R2) to the third resistance value R3 as an output; (iii) the voltage measurement circuit 74 receives at least one of the first or second output measurement voltages VO1, VO2 during the enable or disable phases 32, 36 of the switch control signal VSC, converts this received voltage to a digital form, uses it as well as a previously determined ratio (or relationship) of the common (or related) measurement resistance value R (or R1/R2) to the third resistance value R3 to determine the input voltage VI according to the algorithm discussed above, and provides a representation of the determined input voltage VI as an output; (iv) the voltage measurement circuit 74 receives the first and second output measurement voltages VO1, VO2 during and timed to the enable and disable phases 32, 36 of the switch control signal VSC, converts these received voltages VO1, VO2 to a digital form, and provides the converted first and second output measurement voltages VO1, VO2 as an output; and (v) the voltage measurement circuit 74 receives the first and second output measurement voltages VO1, VO2 during the enable and disable phases 32, 36 of the switch control signal VSC, and provides the received output measurement voltages VO1, VO2 as an output.

FIG. 9 depicts one embodiment of the voltage measurement circuit 74 that can be configured to implement one, a plurality, or all of the above operational schemes. The depicted embodiment includes an analog-to-digital converter 90, a processor 94, and the memory 98. The analog-to-digital converter 90 is configured to receive the first and second output measurement voltages VO1, VO2 from the first and second measurement output terminals VOUT1, VOUT2 in coordination with the enable and disable phases 32, 36 of the switch control signal VSC, and convert the received voltages VO1, VO2 into digital representations of the first and second output measurement voltages VO1, VO2. The analog-to-digital converter 90 is configured to have an awareness of the frequency and duty cycle of the switch control signal VSC, and to receive and convert the first measurement output voltage VO1 during the enable phase 32 of the switch control signal VSC, and then receive and convert the second measurement output voltage VO2 during the disable phase 36 of the switch control signal VSC.

The embodiment of FIG. 9 also includes the processor 94 and memory 98. The processor 94 is configured to manipulate the digital representations of the first and second measurement output voltages VO1, VO2 to determine the ratio (or relationship) of the common (or related) measurement resistance value R (or R1/R2) to the third resistance value R3, as well as the input voltage VI, according to the algorithm discussed herein. The memory 98 is configured to store the digital representations of the first and second measurement output voltages VO1, VO2 generated by the analog-to-digital converter 90, the ratio (or relationship) of the common (or related) measurement resistance value R (or R1/R2) to the third resistance value R3, as well as the input voltage VI, generated by the processor 94, as well as optionally any intermediate representations generated and used by the processor 94.

Other embodiments of the voltage measurement circuit 74 are possible. The voltage measurement circuit 74 can optionally have a multi-function component that implements the functionality of one, a plurality, or all of the components of the voltage measurement circuit 74 depicted in FIG. 9. The voltage measurement circuit 74 can also optionally consist essentially of only routing to deliver the first and second measurement output voltages VO1, VO2 to a different circuit.

Figure 10:
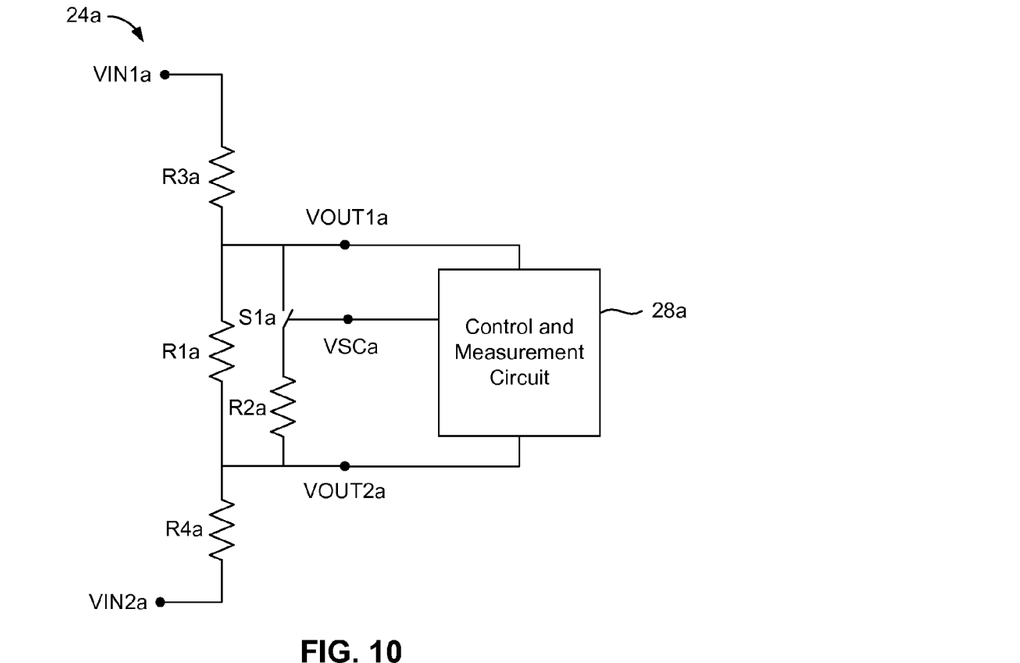
FIG. 10 is a circuit schematic depicting another embodiment of the voltage-measuring circuit.
Figure 11:
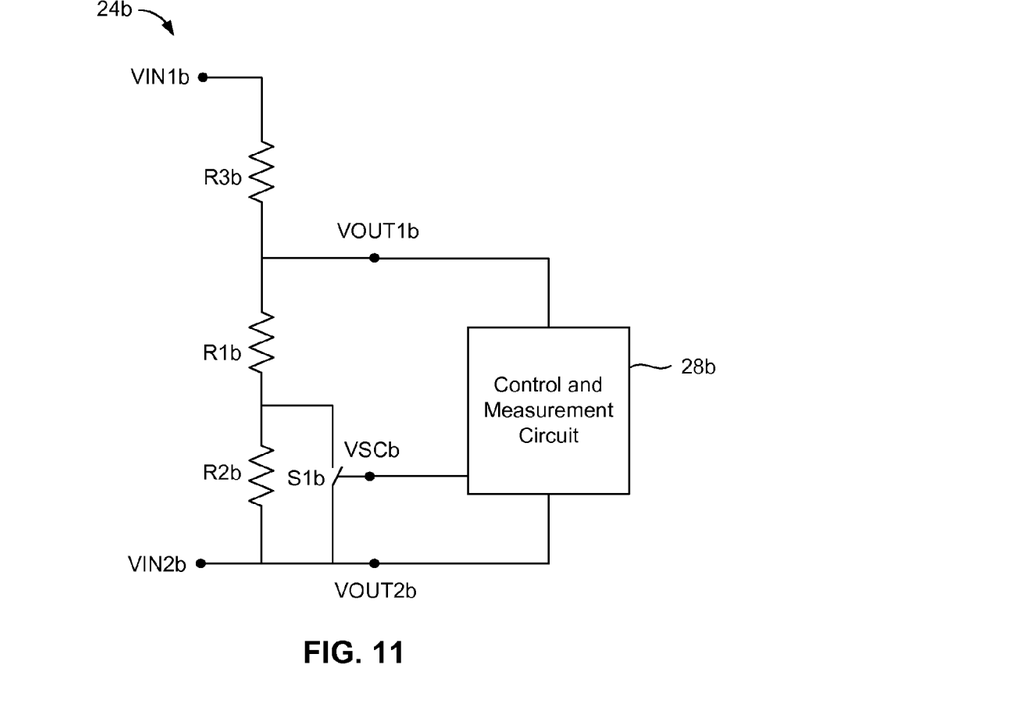
FIG. 11 is a circuit schematic depicting another embodiment of the voltage-measuring circuit.
Figure 12:
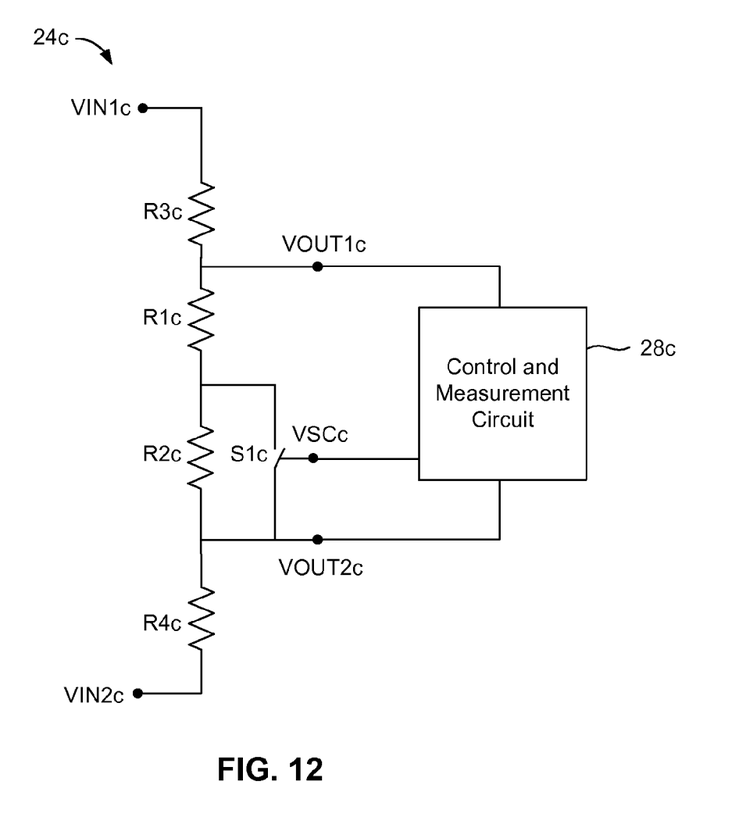
FIG. 12 is a circuit schematic depicting another embodiment of the voltage-measuring circuit.

FIGS. 10, 11, and 12 depict additional embodiments of the voltage measuring circuit 24a, 24b, 24c. In FIG. 10, the configuration and operation of the voltage-measuring circuit 24a is identical to that of the embodiment of FIG. 2, except a fourth resistor R4a is added between the first and second measurement resistors R1a, R2a and the second input terminal VIN2a. Otherwise, the voltage-measuring circuit 24a receives an input voltage VIa across first and second input terminals VIN1a, VIN2a, a third resistor R3a is positioned between the first input terminal VIN1a and the first measurement resistor R1a, a resistor configuration switch S1a receives a switch control signal VSCa at a switching control terminal from a control and measurement circuit 28a, and a measurement output voltage VOa across first and second measurement output terminals VOUT1a, VOUT2a, all configured as in the embodiment of FIG. 2 and operating according to embodiments of the method 50 exemplarily depicted in FIG. 4. The control and measurement circuit 28a of FIG. 10 can be implemented in the same ways as discussed in regard to the control and measurement circuit 28 of FIG. 2.

In the embodiment of FIG. 11, the voltage-measuring circuit 24b is configured and operates similarly, although not identically, to the embodiment of FIG. 2. In FIG. 11, first and second measurement resistors R1b, R2b are brought into and out of a series configuration (instead of a parallel configuration as in the embodiment of FIGS. 2 and 10) in response to the switching action of resistance configuration switch S1b. This generates first and second output voltages VO1b, VO2b across first and second output terminals VOUT1b, VOUT2b that are related to the input voltage VI1b, VI2b across first and second input terminals VIN1b, VIN2b through equations similar, although slightly modified, to those discussed above in regard to the embodiment of FIG. 2. In the embodiment of FIG. 11, during the enable phase 32 of the switch control signal VSCb, the resistance configuration switch S1b is closed, the second measurement resistor R2b is shorted out, and the first measurement output voltage VO1b is the voltage appearing across the first measurement resistor R1b. During the disable phase 36 of the switch control signal VSCb, the resistance configuration switch S1b is open, and the second measurement output voltage VO2b is the voltage appearing across the series combination of the first and second measurement resistors R1b, R2b. Similarly to the discussion of the embodiment of FIG. 2, if first and second measurement resistances R1b, R2b are equal (or of a known accurate relation) there is an ability to accurately determine the ratio (or relationship) between the common (or related) measurement resistance value Rb (or R1b/R2b) and the third resistance value R3b, as well as the input voltage VIb, from the received first and second measurement output voltages VO1b, VO2b. Thus, in the embodiment of FIG. 11, the control and measurement circuit 28b can be implemented in the same ways as discussed in regard to the control and measurement circuit 28 of FIG. 2, with a modification to account for the slight differences in the governing equations that are introduced by the series (instead of parallel) configurability of the first and second measurement resistors R1b, R2b.

FIG. 12 depicts another embodiment of the voltage-measuring circuit 24c that introduces a fourth resistor R4c to a configuration otherwise identical to the embodiment of FIG. 11, in much the same way that the embodiment of FIG. 10 introduces the fourth resistor R4a to a configuration otherwise identical to the embodiment of FIG. 2. Thus, the embodiment of FIG. 12 includes first and second input terminals IN1c, IN2c, first and second measurement resistors R1c, R2c, third resistor R3c, resistor configuration switch S1c having switching control terminal VSCc, first and second measurement output terminals VOUT1c, VOUT2c, and control and measurement circuit 28c, that are configured and operate the same as the corresponding components of the embodiment of FIG. 11.

Embodiments of the voltage-measuring circuit 24 (e.g., embodiments 24, 24a, 24b, 24c of FIGS. 2, 10, 11 and 12) can be implemented in part, or in total, in a single or a plurality of integrated circuits. Implementing parts or all of embodiments of the voltage-measuring circuit 24 in an integrated circuit can enhance aspects of and benefits provided by the voltage-measuring circuit 24. Implementing the first and second measurement resistors R1, R2 as resistors in an integrated circuit eases and enhances the degree to which the first and second measurement resistance values R1, R2 can be made equal or to have an accurate known relation. Resistors can be implemented in an integrated circuit in different ways. The first and second measurement resistors R1, R2 can optionally be implemented as diffusion resistors in an integrated circuit. Such a diffusion resistor includes a semiconductor region or layer that is doped to a predetermined concentration with an impurity to create a resistive region that can be shaped and electrically connected to other integrated circuit elements. The first and second measurement resistors R1, R2 can also optionally be implemented as polysilicon resistors in an integrated circuit. Such a polysilicon resistor includes a layer of polysilicon deposited and processed to have a predetermined shape and resistance value. The first and second measurement resistors R1, R2 can also optionally be implemented as thin-film resistors in an integrated circuit. Such a thin-film resistor includes a layer of resistive material, such as, e.g., tantalum nitride (TaN), silicon chromium (SiCr), or nickel chromium (NiCr), sputtered and processed to have a predetermined shape and resistance value. In any of these cases, i.e., implementation as diffusion, polysilicon, or thin-film resistors, the first and second measurement resistors R1, R2 can be implemented to have a same value or known relation to a very high degree of accuracy by, e.g., being formed at the same time and in a proximate area of an integrated circuit substrate.

Other components of the voltage-measuring circuit 24 can be implemented, and benefit from implementation, in an integrated circuit. The degree to which a part or all of the voltage-measuring circuit is implemented in single or multiple integrated circuits is a parameter that lends the voltage-measuring circuit 24 to be adaptable to inclusion in a wide variety of other systems and circuits. FIGS. 13, 14, 15 and 16 are circuit schematics depicting embodiments of apportionment of components of the voltage-measuring circuit 24 to a specific integrated circuit. Although FIGS. 13, 14, 15 and 16 depict apportionment of the embodiment of the voltage-measuring circuit 24 depicted in FIG. 2, the apportioning embodiments depicted in FIGS. 13, 14, 15 and 16 are equally applicable to any of the embodiments of the voltage-measuring circuit 24, 24a, 24b, 24c depicted in any of FIGS. 2, 10, 11 and 12. Also, other apportionments of components of the voltage-measuring circuit 24 to single or multiple integrated circuits are possible.

Figure 13:
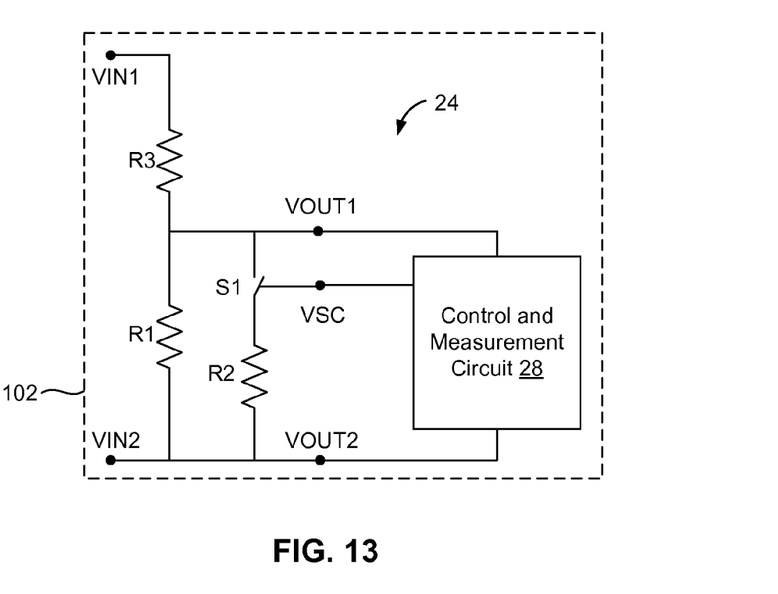
FIG. 13 is a circuit schematic depicting an embodiment of an allocation of portions of the voltage-measuring circuit to a single integrated circuit.

FIG. 13 depicts an embodiment in which the entire voltage-measuring circuit 24 is implemented in a single integrated circuit 102. Note that, although FIG. 13 only shows the voltage-measuring circuit 24, the depicted integrated circuit 102 may also contain other circuits. The embodiment of FIG. 13 can be advantageous in different scenarios. For example, this embodiment can be advantageous when the voltage-measuring circuit 24 is implemented as part of a larger overall system that is contained on the integrated circuit 102, and as such it may be desirable for the voltage-measuring circuit 24 to be included in its entirety within the system. Alternatively, the embodiment of FIG. 13 can also be advantageous when the voltage-measuring circuit 24 is implemented as a modular or stand-alone component in a multi-module or multiple-integrated-circuit system.

Figure 14:
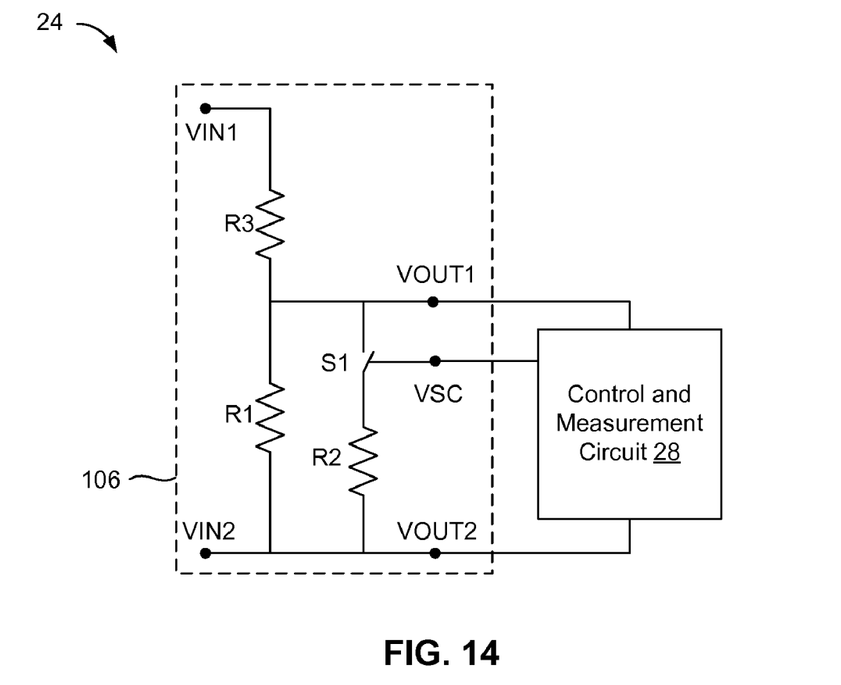
FIG. 14 is a circuit schematic depicting another embodiment of an allocation of portions of the voltage-measuring circuit to a single integrated circuit.

FIG. 14 depicts an embodiment in which the first and second measurement resistors R1, R2, as well as the third resistor R3 and resistor configuration switch S1, are implemented on a single integrated circuit 106, but the control and measurement circuit 28 is implemented separately (i.e., not on the depicted integrated circuit 106). The embodiment of FIG. 14 can also be advantageous in a number of different scenarios. For example, this embodiment can be advantageous when the voltage-measuring circuit 24 is implemented as part an overall system having a portion from which the functionality of the control and measurement circuit 28 can be derived (and possibly shared with other parts of the system). Such a system may have, e.g., a processor that performs many tasks, and which can be used to also perform the functionality of the control and measurement circuit 28. The embodiment of FIG. 14 can also be advantageous from a modular perspective, in that it enables flexibility in designing end-application circuits and associated specific details of the control and measurement functionality, while still implementing a large portion of the architecture of the voltage-measuring circuit 24 in a single integrated circuit.

Figure 15:
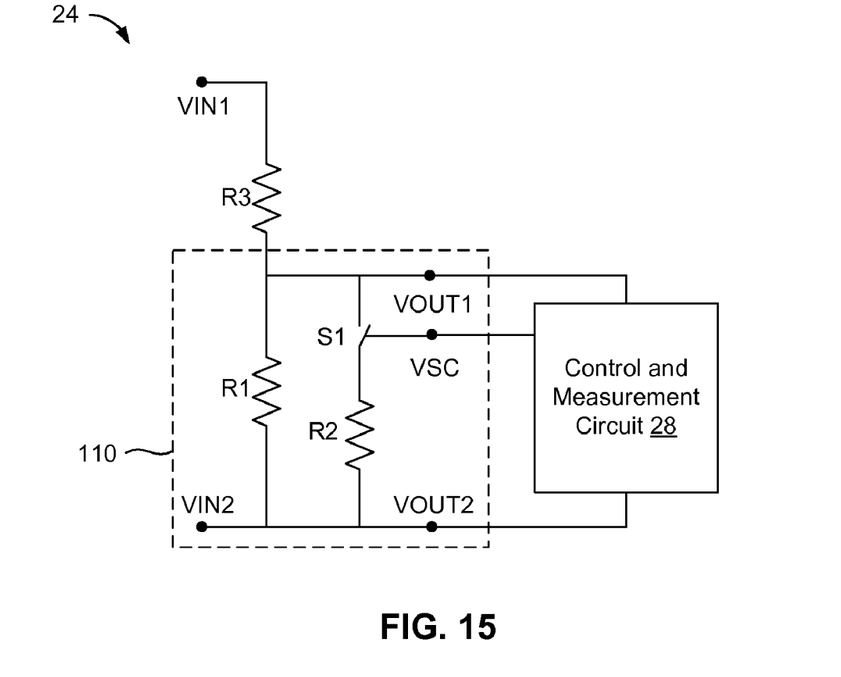
FIG. 15 is a circuit schematic depicting another embodiment of an allocation of portions of the voltage-measuring circuit to a single integrated circuit.

FIG. 15 depicts an embodiment in which the first and second measurement resistors R1, R2 and the resistor configuration switch S1 are implemented on a single integrated circuit 110, but the third resistor R3 and the control and measurement circuit 28 are implemented separately (i.e., not on the depicted integrated circuit 103). The embodiment of FIG. 15 can be advantageous in different scenarios as well. For example, this embodiment can be advantageous when the third resistor R3 is too large to be practically implemented on the integrated circuit 110, or when it is effectively already implemented in another part of a system having the voltage-measuring circuit 24 (whether as an integrated resistor or as an external resistor), while at the same time achieving possible advantages of separate implementation of the control and measurement circuit 28, as discussed above in regard to FIG. 14.

Figure 16:
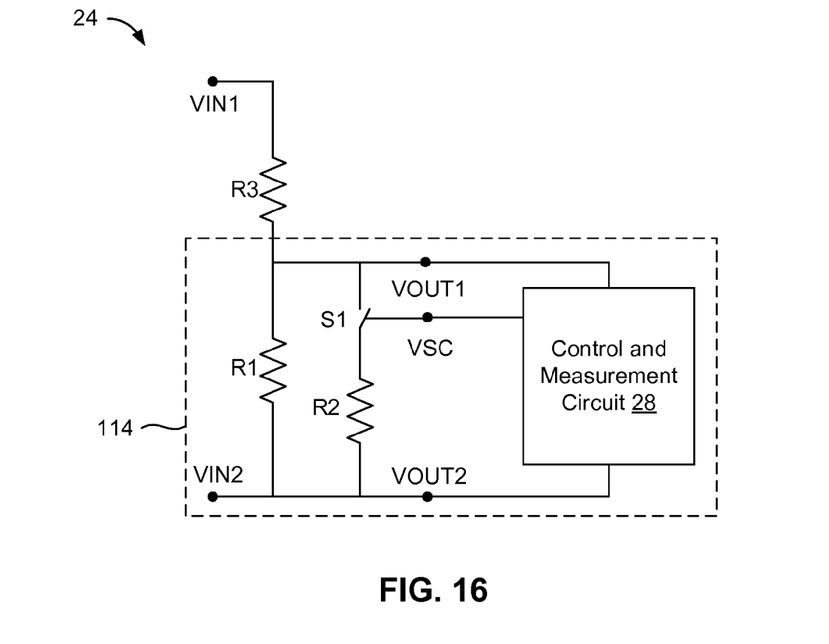
FIG. 16 is a circuit schematic depicting another embodiment of an allocation of portions of the voltage-measuring circuit to a single integrated circuit.

FIG. 16 depicts an embodiment in which the first and second measurement resistors R1, R2, the resistor configuration switch S1, and the control and measurement circuit 28 are implemented on a single integrated circuit 114, but the third resistor R3 is implemented separately (i.e., not on the depicted integrated circuit 114). The embodiment of FIG. 16 can also be advantageous in different scenarios. For example, this embodiment can achieve the possible advantages of separately implementing the third resistor R3, as discussed above in regard to FIG. 15, while retaining closer control over the implementation of the control and measurement circuit 28 as part of the integrated circuit 114, as may be desirable to achieve predetermined design objectives.

Figure 17:
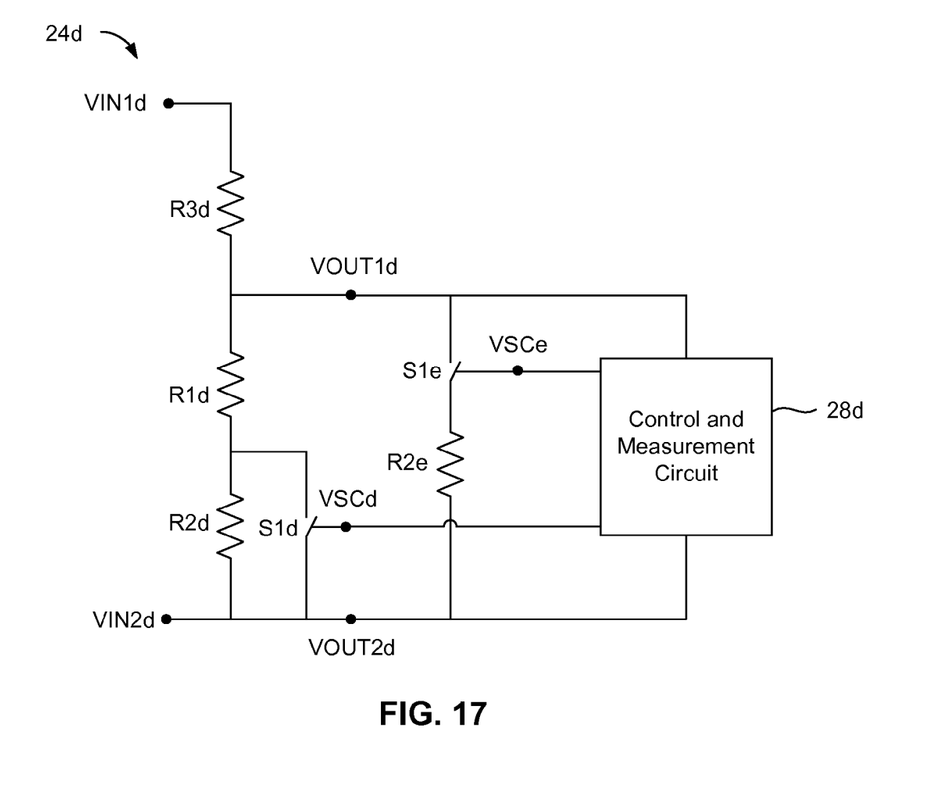
FIG. 17 is a circuit schematic depicting another embodiment of the voltage-measuring circuit.

Other embodiments of the voltage-measuring circuit 24 are also possible. For example, the resistor configuration switch S1 and control and measurement circuit 28 can be implemented on a single integrated circuit with the first and second measurement resistors R1, R2 and third resistance R3 being external to any integrated circuit. The first and second measurement resistors R1, R2 can also optionally be first and second measurement impedances, and the third resistance R3 can likewise optionally be a third impedance. Other aspects and components of various embodiments of the voltage-measuring circuit 24 described herein can also be combined and mixed with each other to create new embodiments of the voltage-measuring circuit 24. For example, multiple instances of the voltage-measuring circuit 24 can be combined to create a multi-channel voltage-measuring circuit 24. In another example, the parallel-configuration and series-configuration embodiments of the voltage-measuring circuit 24, 24b of FIGS. 2 and 11 can be combined in a single embodiment 24d, exemplarily depicted in FIG. 17. The depicted embodiment of the voltage-measuring circuit 24d includes all of the components of both the parallel- and series-configurable embodiments, including first and second input terminals VIN1d, VIN2d, first measurement resistor R1d, series- and parallel-configurable second measurement resistors R2d, R2e, series and parallel resistor configuration switches S1d, S1e, series- and parallel-configuration switch control signals VSCd, VSCe, first and second output terminals VOUT1d, VOUT2d, and a control and measurement circuit 28d configured to implement the functionalities of both the parallel- and series-configurable embodiments 24, 24b.

What is claimed is:

1. A voltage-measuring circuit, comprising:
a voltage divider including first and third resistors connected in series between a pair of input terminals and connected to each other at an intermediate node, the input terminals configured to receive an input voltage;
a second resistor and a switch, the second resistor connected to a first pass-through terminal of the switch and to one of the input terminals, the switch having a second pass-through terminal connected to the intermediate node; and
a measurement circuit connected to the intermediate node and the one of the input terminals to provide a measurement of the input voltage.

2. The voltage-measuring circuit of claim 1, wherein the measurement circuit is configured to evaluate a magnitude of the input voltage based on a pair of voltages sampled from across the intermediate node and the one of the input terminals, including:
a first voltage sampled when the switch is closed to connect the second resistor substantially directly in parallel with the first resistor; and
a second voltage sampled when the switch is opened to disconnect the second resistor from being substantially directly in parallel with the first resistor.

3. The voltage-measuring circuit of claim 1, wherein first and second resistors are formed as part of a single integrated circuit.

4. The voltage-measuring circuit of claim 3, wherein the measurement circuit is formed as part of the single integrated circuit.

5. The voltage-measuring circuit of claim 3, wherein the third resistor is formed as part of the single integrated circuit.

6. The voltage-measuring circuit of claim 3, wherein the third resistor is external to the single integrated circuit.

7. A voltage-measuring circuit, comprising:
a voltage divider including first, second and third resistors connected in series between a pair of input terminals, the first and second resistors connected to each other at a first intermediate node, the first and third resistors connected to each other at a second intermediate node, the input terminals configured to receive an input voltage;
a switch having a first pass-through terminal connected to the first intermediate node and a second pass-through terminal connected to one of the input terminals; and
a measurement circuit connected to the second intermediate node and the one of the input terminals, to provide a measurement of the input voltage.

8. The voltage-measuring circuit of claim 7, wherein the measurement circuit is configured to evaluate a magnitude of the input voltage based on a pair of voltages sampled from across the intermediate node and the one of the input terminals, including:
a first voltage sampled when the switch is closed to short out the second resistor from the voltage divider; and
a second voltage sampled when the configuration switch is opened to not short out the second resistor from the voltage divider.

9. The voltage-measuring circuit of claim 7, wherein first and second resistors are formed as part of a single integrated circuit.

10. The voltage-measuring circuit of claim 9, wherein the measurement circuit is formed as part of the single integrated circuit.

11. The voltage-measuring circuit of claim 9, wherein the third resistor is formed as part of the single integrated circuit.

12. The voltage-measuring circuit of claim 9, wherein the third resistor is external to the single integrated circuit.

13. A voltage-measuring circuit, comprising:
a first resistor connected to a first output node;
a second resistor connected to the first resistor and a second output node;
a switch configured to, in response to a control signal, selectively interconnect the first and second resistors, during enable and disable phases of the control signal respectively, into and out of at least one of: a parallel configuration of the first and second resistors, or a series configuration of the first and second resistors; and
a control and measurement circuit configured to provide the control signal, receive a first output voltage from the first and second output nodes during the enable phase, and receive a second output voltage from the first and second output nodes during the disable phase.

14. The voltage-measuring circuit of claim 13, further comprising:
first and second input nodes configured to receive an input voltage; and
a third resistor connected between the first input node and the first resistor,
wherein the second input node is connected to the second output node.

15. The voltage-measuring circuit of claim 14, wherein the first and second resistors have a common resistance value, and the control and measurement circuit is configured to determine a ratio of the common resistance value to a resistance value of the third resistor based on the received first and second output voltages.

16. The voltage-measuring circuit of claim 15, wherein the control and measurement circuit is configured to determine the input voltage based on one of the first and second output voltages and the determined ratio.

17. The voltage-measuring circuit of claim 14, wherein the first and second resistors have resistance values of a predetermined ratio, and the control and measurement circuit is configured to determine a relationship between a resistance value of the third resistor and the predetermined ratio based on the received first and second output voltages.

18. The voltage-measuring circuit of claim 14, wherein the control and measurement circuit includes:
a control circuit configured to provide the control signal to the switch; and
a measurement circuit configured to receive the first and second output voltages from the first and second output nodes during the enable and disable phases.

19. The voltage-measuring circuit of claim 18, wherein the control circuit includes:
a clock circuit configured to generate a clock signal;
a control logic circuit configured to receive the clock signal and provide the control signal based on the clock signal; and
a memory configured to store an instruction related to the generation of the clock signal.

20. The voltage-measuring circuit of claim 18, wherein the measurement circuit includes:
an analog-to-digital converter configured to receive and convert to a digital representation the first and second output voltages during the enable and disable phases;
a processor configured to determine (i) a ratio of a resistance value of the third resistor to a common resistance value of the first and second resistors based on the first and second output voltages, and (ii) the input voltage based on the determined ratio and one of the first and second output voltages; and
a memory configured to store the digital representations of the first and second output voltages, the determined a ratio, and the determined input voltage.

21. The voltage-measuring circuit of claim 13, wherein the first and second resistors comprise separate portions of a resistive layer formed on a substrate, the resistive layer being selected from a group consisting of a diffusion layer and a polysilicon layer.

22. The voltage-measuring circuit of claim 13, wherein the switch is configured to, in response to the control signal, selectively:
connect the first and second resistors to be electrically in parallel with each other so that the first output voltage is a voltage across the parallel combination of the first and second resistors during the enable phase; and
disconnect the second resistor from being electrically in parallel with the first resistor so that the second output voltage is a voltage across only the first resistor during the disable phase.

23. The voltage-measuring circuit of claim 13, wherein the switch is configured to, in response to the control signal, selectively:
connect the first and second resistors to be electrically in series with each other so that the second output voltage is a voltage across the series combination of the first and second resistors during the disable phase; and
short out the second resistor so that the first output voltage is a voltage across only the first resistor during the enable phase.

24. The voltage-measuring circuit of claim 13, wherein the first and second resistors, the configuration switch, and the control and measurement circuit are formed on a single integrated circuit.

25. A method, comprising:
providing an enable phase of a control signal to a switch to configure an interconnection of first and second resistors of a circuit, wherein the interconnection includes at least one of: a parallel combination of the first and second resistors, or a series combination of the first and second resistors;
receiving, by a control and measurement circuit, a first output voltage produced by the circuit while the interconnection exists;
providing a disable phase of the control signal to the switch to disconnect the interconnection of the first and second resistors; and
receiving, by the control and measurement circuit, a second output voltage produced by the circuit while the interconnection is disconnected.

26. The method of claim 25, further comprising:
determining a ratio between a resistance value of a third resistor, connected to the first resistor, and a common resistance value of the first and second resistors based on the received first and second output voltages.

27. The method of claim 26, further comprising:
determining the input voltage based on (i) the determined ratio and (ii) one of the first and second output voltages.

28. The method of claim 25, further comprising:
determining a relationship between (i) a resistance value of a third resistor, connected to the first resistor, and (ii) a ratio of a resistance value of the first resistor to a resistance value of the second resistor, wherein the determining is based on the received first and second output voltages.

29. The method of claim 28, further comprising:
determining the input voltage based on (i) the determined relationship and (ii) one of the first and second output voltages.

30. The method of claim 25, wherein the providing the enable phase of the control signal to the switch, the receiving by the control and measurement circuit of the first output voltage, the providing the disable phase of the control signal to the switch, and the receiving by the control and measurement circuit of the second output voltage occurs on a single integrated circuit.

31. The method of claim 25, wherein configuring the interconnection includes connecting the first and second resistors into a parallel configuration, and disconnecting the interconnection includes disconnecting the first and second resistors from being in the parallel configuration.

32. The method of claim 25, wherein configuring the interconnection includes configuring the first and second resistors into a series configuration, and disconnecting the interconnection includes disconnecting the first and second resistors from being in the series configuration.

33. A voltage-measuring circuit, comprising:
a first impedance connected to a first output node;
a second impedance connected to the first impedance and a second output node;
a switch configured to, in response to a control signal, selectively interconnect the first and second impedances, during enable and disable phases of the control signal respectively, into and out of at least one of: a parallel configuration of the first and second impedances, or a series configuration of the first and second impedances; and
a control and measurement circuit configured to provide the control signal, receive a first output voltage from the first and second output nodes during the enable phase, and receive a second output voltage from the first and second output nodes during the disable phase.

34. The voltage-measuring circuit of claim 33, further comprising:
first and second input nodes configured to receive an input voltage; and
a third impedance connected between the first input node and the first impedance,
wherein the second input node is connected to the second output node.

35. The voltage-measuring circuit of claim 34, wherein the first and second impedances have a common impedance value, and the control and measurement circuit is configured to determine a ratio of the common impedance value to a impedance value of the third impedance based on the received first and second output voltages.

36. The voltage-measuring circuit of claim 35, wherein the control and measurement circuit is configured to determine the input voltage based on one of the first and second output voltages and the determined ratio.

37. The voltage-measuring circuit of claim 34, wherein the first and second impedances have impedance values of a predetermined ratio, and the control and measurement circuit is configured to determine a relationship between an impedance value of the third impedance and the predetermined ratio based on the received first and second output voltages.

38. The voltage-measuring circuit of claim 33, wherein the switch is configured to, in response to the control signal, selectively:
 connect the first and second impedances to be electrically in parallel with each other so that the first output voltage is a voltage across the parallel combination of the first and second impedances during the enable phase; and
 disconnect the second impedance from being electrically in parallel with the first impedance so that the second output voltage is a voltage across only the first impedance during the disable phase.

39. The voltage-measuring circuit of claim 33, wherein the switch is configured to, in response to the control signal, selectively:
 connect the first and second impedances to be electrically in series with each other so that the second output voltage is a voltage across the series combination of the first and second impedance during the disable phase; and
 short out the second impedance so that the first output voltage is a voltage across only the first impedance during the enable phase.

* * * * *